United States Patent [19]

Krimmel

[11] 4,133,702
[45] Jan. 9, 1979

[54] METHOD OF PRODUCING STRUCTURED LAYERS ON A SUBSTRATE BEING IRRADIATED WITH TWO COHERENT PARTICLE BEAMS

[75] Inventor: Eberhard Krimmel, Pullach, Germany

[73] Assignee: Siemens Aktiengesellschaft, Berlin & Munich, Germany

[21] Appl. No.: 823,716

[22] Filed: Aug. 11, 1977

[30] Foreign Application Priority Data

Sep. 22, 1976 [DE] Fed. Rep. of Germany ....... 2643893

[51] Int. Cl.² ...................... H01L 7/54; H01L 21/265
[52] U.S. Cl. .................................. 148/1.5; 29/576 B; 29/576 E; 148/175; 250/492 A; 357/91
[58] Field of Search ........................ 29/576 B, 576 E; 156/643; 250/492 A, 492 B; 148/1.5, 175; 357/91

[56] References Cited

U.S. PATENT DOCUMENTS

| | | | |
|---|---|---|---|
| 3,520,741 | 7/1970 | Mankarious | 148/175 |
| 3,582,958 | 6/1971 | Hendricks, Jr. | 346/74 |
| 3,619,608 | 11/1971 | Westerberg | 250/49.5 C |
| 3,709,741 | 1/1973 | Gibson et al. | 148/1.5 |
| 3,833,814 | 9/1974 | Nablo | 250/492 |
| 3,924,136 | 12/1975 | Heynick et al. | 250/492 A |
| 3,999,072 | 12/1976 | Takagi | 250/427 |
| 4,035,655 | 7/1977 | Guernet et al. | 250/492 A |

OTHER PUBLICATIONS

Chang et al., "Smooth . . . Layers of GaAs . . . by MBE", Appl. Phys. Letts. 28 (1976) 39.

Naganuma et al., "Ionized Zn Doping of GaAs Molecular Beam Epitaxial Films", Appl. Phys. Letts. 27 (1975) 342.

Matsunaga et al., "MBE with Ionized Dopant", Electr. Engg. in Japan, 95 (1975) 28–32.

Primary Examiner—R. Dean
Assistant Examiner—Upendra Roy
Attorney, Agent, or Firm—Hill, Gross, Simpson, Van Santen, Steadman, Chiara & Simpson

[57] ABSTRACT

A monocrystalline layer having select structures therein is deposited on a substrate surface from a gas phase or via a molecular beam while the substrate surface is being irradiated with two coherent particle beams superimposed in relation to one another. The coherent particle beams are comprised of particles having an energy of about 10 keV and the substrate is positioned relative to the particle beams so that a maxima of an interference pattern formed by such particle beams is located on the substrate surface.

10 Claims, 2 Drawing Figures

METHOD OF PRODUCING STRUCTURED LAYERS ON A SUBSTRATE BEING IRRADIATED WITH TWO COHERENT PARTICLE BEAMS

BACKGROUND OF THE INVENTION

1. Field of the Invention

The invention relates to a method of producing monocrystalline layers on a substrate in somewhat more particularly to a method of producing monocrystalline structured layers on a substrate surface.

2. Prior Art

In semiconductor technology, semiconductors are required which have a periodic superstructure in a surface thereof wherein the distance between the periods of such structures is larger than or is a multiple of a lattice constant of the semiconductor. Further examples wherein semiconductors having select structures in a surface thereof may be found in laser technology, for example, in tuning of solid-state lasers and light waveguides. Such structured semiconductor layers are also required in the production of other components wherein, for example, monocrystalline polycrystalline regions or zones or heterogeneous monocrystalline zones are positioned in close proximity to one another. A method for producing such structured semiconductor layers is, for example, described in an article appearing in "IEEE Transactions on Electronic Devices", Vol. ED-18 (1971), pages 45-49. In this method, which is sometimes referred to as "selective epitaxy deposition", narrow areas or zones having a monocrystalline structure and similar interposed areas having a polycrystalline structure are formed in a semiconductor layer by epitaxy deposition. In this process, individual areas having polycrystalline structure are positioned via a photo-lithographic technique onto a surface of a monocrystalline substrate and an epitaxial deposition is then performed. Material in polycrystalline form is deposited on those areas of the substrate surface on which the polycrystalline "seed" material is present and material in monocrystalline form is deposited on those areas of the substrate surface which are not covered with the polycrystalline seed material, i.e. those areas which are monocrystalline. The minimum spacing between two monocrystalline areas or zones so-produced is dependent upon a number of factors, for example on how sharp or precise of an image of the photomask is transmitted to the photo resist, the degree of edge under-etching that occurs during the development of the exposed photo resist, etc. Accordingly, this "selective epitaxy deposition" process cannot be utilized to produce structures having dimensions smaller than about 0.5 μm. Further, this prior art method is unsuitable for depositing strips of monocrystalline material onto an amorphous substrate.

SUMMARY OF THE INVENTION

The invention provides a method of producing a structured monocrystalline layer on a substrate whereby structure dimensions for the so-produced monocrystalline structure areas or zones may be below about 100 nm and such small monocrystalline areas may be positioned on amorphous substrates, In accordance with the principles of the invention, a monocrystalline layer is deposited on a substrate surface from a gas phase or via a molecular beam while the substrate surface is irradiated with at least two coherent particle beams, each having particles with an energy greater than about 10 keV, superimposed in relation to one another and the substrate surface is positioned relative to such particle beams in such a manner that the maxima of an interference pattern formed by such beams are located on the substrate surface. In certain embodiments of the invention, such coherent particle beams are ion beams, which in certain embodiments of the invention consist of particles of the material being deposited on the substrate surface. Further, in certain embodiments of the invention, the particle beams may contain particles which have a doping effect on the material being deposited. In certain embodiments of the invention, an electrical field having one component located in the plane of the substrate surface is maintained on the substrate during the deposition of the monocrystalline layer on such substrate, which may be amorphous or monocrystalline. The charged particles may be produced by an electron beam vaporization source and an electrostatic filament biprism may be utilized to produce two coherent particle beams from such particle source.

DESCRIPTION OF PREFERRED EMBODIMENTS

Figure 1:
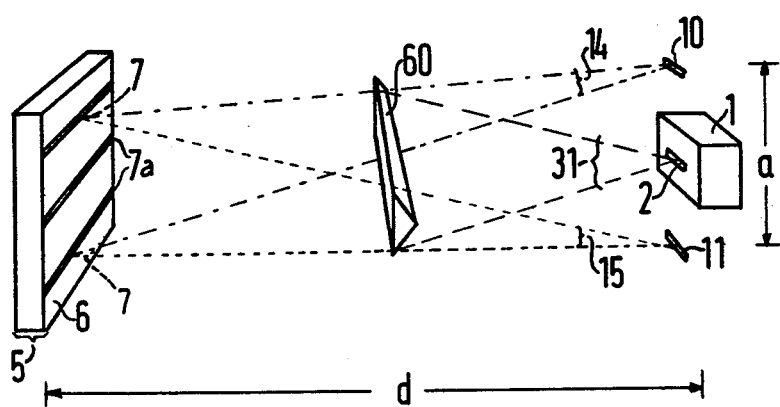
FIG. 1 is an elevated, somewhat schematic, view of an arrangement for producing two coherent superimposed particle beams which are useful in the practice of the invention.

The invention provides a method of producing extremely fine sized structures in a monocrystalline layer deposited on a substrate.

During the development of the invention, it was known that an orientated growth of a chromium layer occurred during vapor deposition of chromium when, substantially simultaneously with vapor deposition, the substrate on which the chromium was being deposited was bombarded with chromium ions. Further, it was known that thin films vapor-deposited under simultaneous self-ion irradiation, exhibited a strong cross-linkage with the substrate and that even with amorphous substrates, a preferred crystallite orientation was present in such a vapor-deposited layer (see "Physica Status Solidi", (a) Vol 7, (1971), pages 141-150). The preferred crystalline growth of such layers, which are vapor-deposited with simultaneous ion bombardment, may be explained by an orientation of crystalline nuclei caused by the ion bombardment and the subsequent epitaxial growth of crystalline material on such orientated nuclei so that an accumulation of material on such nuclei takes place in a self-orientating manner. However, an orientation of the nuclei or nucleation centers may also be attained by heavily charging the nucleation center themselves so that a strong electrical field prevails on the surface of the substrate. A preferred orientation direction favoring monocrystalline growth may thus be determined by such a surface field. On the basis of such an electrical field, which can be very high in polarization fields, the surface diffusion in the growth process toward the nuclei does not proceed isotropically but rather in the preferred direction. An additional effect which occurs during the formation of a layer via vapor deposition and simultaneous ion bombardment is that a so-formed layer exhibits a very great adhesion to the underlying substrate. This later feature is already utilized in the art with a method known as "ion plating" (see "J. Vac. Sci. Technology", Vol 10 (1973) pages 47-52). However, with this method, the kinetic energy of the penetrating ions must not exceed a specific magnitude since the atomization or sputtering otherwise caused by such ions becomes larger than the accumulation of the vapor-deposited material. On the other hand, the utilization of low energy ions produces low current densities so that an insufficiently high charging of the surface nuclei results from such a low energy ion beam. In accordance with the principles of the invention, the energy imparted onto the irradiated ions is above about 10 keV. A current density thus attained insures that the total number of particles which condense from the ion flux and from the vapor particle flux is smaller than the number of particles which are atomized or sputtered by the impinging ions. By using ions having a kinetic energy above about 10 keV, a sufficiently high charging of the surface nuclei is attained so that an orientated film growth on such nuclei occurs. The invention also makes use of the fact that moving particle beams have a wave-like nature so that interference phenomena can occur with particle beams. An associated wavelength for a moving particle having a mass, m, and an energy, E. may be ascertained from the de Broglie equation:

$$\lambda = h/p = h/\sqrt{2mE}$$

wherein h is Planck's constant and p is the momentum of the moving particle. Thus, for example, a silicon particle having an atomic mass of about 28 and an energy of 10 keV has a wavelength of about 2.5 × $10^{-12}$ cm. In accordance with the principles of the invention, a particle stream of moving ions is coherently divided, for example, by an electrostatic filament biprism or a magnetostatic, matter-free biprism so as to produce at least two coherent particle beams or sub-beams, which are superimposed in relation to one another so that an interference pattern occurs. For example, one may obtain a parallely extending stripe-like maxima and minima as an interference pattern. In accordance with the principles of the invention, a monocrystalline layer is deposited on a substrate while substantially simultaneously the substrate surface is irradiated with at least two coherent particle beams or sub-beams superimposed in relation to one another and the substrate surface is positioned in such a manner that the maxima and minima of an interference pattern formed by such superimposed particle beams is located on the substrate surface. On the basis of the above-described principles, a preferred orientated crystalline material growth occurs at the areas or zones of such maxima. In instances where the substrate per se is amorphous, the deposited layer may, for example, be provided with a structured pattern by superpositioning of an interference pattern comprised of parallel maxima stripe-like zones. Such a structure pattern thus corresponds with the interference pattern and is comprised of monocrystalline strips formed at the areas of the maxima, between which polycrystalline material strips are deposited. In this manner, a structured layer (i.e., a layer having a superstructure thereon) is obtained. In the practice of the invention, particle beams comprised of dopant material ions may also be utilized, for example with a monocrystalline substrate. Further, in instances where a layer is epitaxially deposited on a substrate surface from a suitable gas phase and such surface is positioned so that an interference pattern of at least two particle beams is present or located on the surface, then one can obtain an epitaxial layer having a periodic dopant structure therein. Monocrystalline layers may also be produced by following the principle of the invention wherein individual structure strips are composed of mixed crystals. For example, a beam of phosphorous atoms may be utilized as the particle beam during the deposition of a gallium arsenide layer from a suitable gas phase so that at the areas or zones of the maxima, a particularly high concentration of phosphorus is present and a gallium arsenide phosphite crystal forms at such areas. The invention may also be practiced with molecular beam epitaxy for connective semiconductors wherein, for example, a select molecular beam is ionized and then guided through a beam divider means, such as biprism in accordance with the principles of the invention.

A process in accordance with the principles of the invention is thus advantageous, since by using a particle beam divider, such as an electrostatic filament biprism, the spacing of interference strips can be controlled by a control of the voltage applied to the filament and/or by controlling the acceleration voltage imparted to the particles or ions in the particle beam. Another advantage realized in the practice of the invention comprises in that the element utilized to produce the particle beams and thus the element used to produce the layer accreted, may be positioned at a large distance from the substrate being irradiated so that the substrate surface is not endangered in any way. Yet another advantage realized in the practice of the invention is that the structured areas (i.e. monocrystalline areas) can be grown under certain conditions at temperatures of about 200° C. Substantially no undesirable diffusion phenomena can occur at such low temperatures between the layer being grown and the substrate or between the individual structure areas and the growing layer.

Referring now to the drawing wherein like reference numerals are utilized to designate like parts, FIG. 1 schematically illustrates an arrangement for producing two coherent particle beams superimposed in relation to one another, which are useful in the practice of the invention. An ion source 1 having an opening slit 2 produces an ion beam 31 directed outwardly toward a beam divider means, such as a biprism 60, drawn in analogy to light optical features. The ion beam 31 is divided by the biprism 60 in such a manner that two coherent sub-beams 14 and 15 are formed and which seem to originate from virtual beam sources 10 and 11, respectively. As shown, the sub-beams 14 and 15 are superimposed in relation to one another and an interference pattern 7 is formed thereby. A substrate 5 having a surface 6 is positioned in an operational environment (not shown for sake of clarity) so that the interference pattern 7 is located in the plane containing the surface 6. With an arrangement having a rectangular opening slit 2 and a biprism 60 positioned parallel to such slit, the resulting interference pattern comprises a plurality of parallely extending interference fringes 7a.

Figure 2:
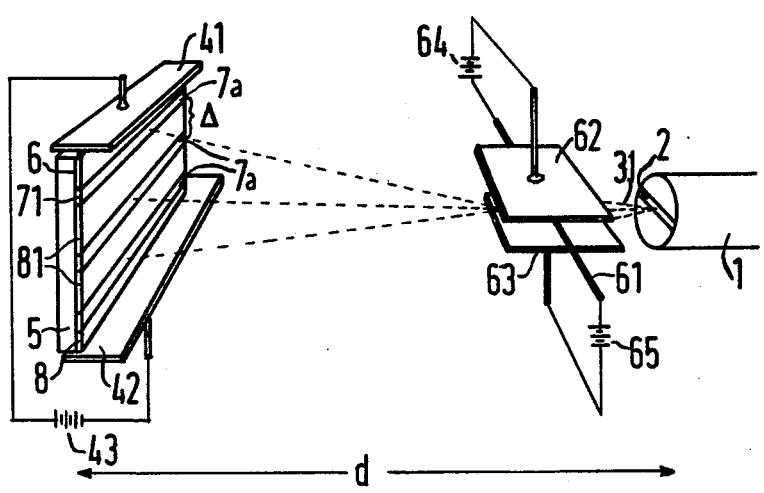
FIG. 2 is a somewhat similar view of an apparatus embodiment useful in the practice of the principles of the invention.

FIG. 2 illustrates, schematically, essential elements of an apparatus embodiment useful in the practice of the invention. This exemplary embodiment was designed to produce a monocrystalline silicon layer on a substrate, such as composed of sapphire. The particle source 1 produces not only neutral or molecular particles but also ions, which may be composed of the material being deposited. A preferred particle source comprises an electron beam vaporizer wherein the material (silicon)

being vapor-deposited is heated to the requisite temperature via an electron beam. Such a particle source produces neutral particles as well as ionized particles. The resulting particle beam 31 is guided through an electrostatic filament biprism comprised of a pair of spaced apart electrodes 62 and 63 having a thin filament 61 therebetween. Controllable voltage sources 64 and 65 are operationally coupled between the filament 61 and electrodes 62 and 63, respectively. However, in a preferred embodiment, a single voltage source may be utilized and both electrodes may be biased against the same potential, preferably a ground potential. Any neutral particles within beam 31 are not influenced by the beam divider. However, ions or charged particles within beam 31 are divided into two particle beams which are coherent in relation to one another. Therefore, upon passing through the beam divider, one obtains ion interference fringes 7a on a substrate surface 6. The particle source 1 is provided with acceleration electrodes so that the ions present in particle beam 31 have a kinetic energy of about about 10 keV. A sapphire substrate 5 is positioned between electrodes 41 and 42, which may be operationally connected to a voltage source 43 or to ground. The electrical field generated by these electrodes has at least one component thereof in the plane containing the substrate surface 6. The substrate and associated electrodes are positioned within an operational environment and arranged in relation to the particle beams so that the interference pattern of such beams is located at the surface 6 of the substrate. Upon energization of a silicon vapor source, which may be identical with or different from the particle source, along with the arrangement shown, a monocrystalline silicon layer 8 having structured monocrystalline strips 71 is produced. The electrical field which lies in the plane of the substrate surface effects the orientation of the nucleation centers, nuclei or islands, on a substrate surface, which are also charged by the impinging ions. In the areas of the interference maxima where a large concentration of ions are impinging, a large accumulation of charged nuclei occur. These charged nuclei, together with the electrical field produced by the electrodes associated with the substrate, such as 41 and 42, cause an orientated accumulation of material to occur in the interference areas 7a so that monocrystalline strips 71 grow in the substrate surface 6. Areas 81 of layer 8, which are located between strips 71 are composed of polycrystalline material. In the exemplary embodiment, the kinetic energy of the irradiated silicon ions was about 10 keV so that in accordance with the de Broglie equation, the wavelength of the impinging ions was about $2.5 \times 10^{-12}$ cm. In order to determine the spacing a between the two virtual beam sources, the following equation may be utilized:

$$a = (\lambda \times d)/\Delta$$

wherein $\lambda$ is the de Broglie wavelength, d is the distance between the ion source and the substrate and $\Delta$ is the spacing between the monocrystalline strips 71. In the exemplary embodiment, the distance, d, between the ion source and the substrate surface is equal to 300cm while the distance, d, between the virtual ion sources is about 26 $\mu$m so that a strip spacing, $\Delta$, of about $10^{-6}$ cm is obtained. The distance, d, may be controlled by an appropriate control of the voltage on the filament biprism, such as from sources 64 and 65. In preferred embodiments, the filament has a thickness of less than 1 $\mu$m. The distance between the electrodes 62 and 63 is about 10 mm. The voltage applied between the filaments and the electrodes is on the order of several volts, however, such applied voltage is variable and generally depends on the kinetic energy, E, on the ions.

As is apparent from the foregoing specification, the present invention is susceptible to being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is said forth and defined in the hereto appended claims.

I claim as my invention:

1. A method of producing a structured monocrystalline layer on a substrate comprising:
   vapor-depositing a material onto a substrate surface from a source of said material;
   substantially simultaneously irradiating said substrate surface with at least two coherent particle beams superposed in relation to one another, each beam having particles with an energy of more than about 10 keV; and
   arranging said substrate surface in such a manner that the maxima of an interference pattern formed by said particle beams are located on said substrate surface.

2. A method as defined in claim 1 wherein said coherent particle beams are ion beams.

3. A method as defined in claim 1 wherein said coherent particle beams are composed of particles of the material being vapor-deposited on the substrate surface.

4. A method as defined in claim 1 wherein an electrical field is maintained during the vapor-deposition of said material onto the substrate surface, said field having at least one component located in a plane containing the substrate surface on which deposition takes place.

5. A method as defined in claim 1 wherein said substrate is composed of an amorphous material.

6. A method as defined in claim 1 wherein said substrate is composed of a monocrystalline material.

7. A method as defined in claim 1 wherein an electron beam vaporization source is utilized as the source of the material being vapor-deposited.

8. A method as defined in claim 1 wherein said coherent particle beams contain particles which have a dopant effect in the material of the layer being vapor-deposited.

9. A method as defined in claim 2 wherein said coherent ion beams are produced via an electrostatic filament biprism.

10. A method as defined in claim 7 wherein said electron beam vapor source is utilized as the source of said coherent particle beams.

* * * * *